United States Patent
Xue et al.

(10) Patent No.: US 12,266,914 B2
(45) Date of Patent: Apr. 1, 2025

(54) METHOD FOR PROCESSING INTERPHASE SHORT CIRCUIT

(71) Applicant: BAODING YUXIN ELECTRIC TECHNOLOGY CO., LTD., Hebei (CN)

(72) Inventors: Zhanyu Xue, Hebei (CN); Jinchun Xing, Hebei (CN)

(73) Assignee: BAODING YUXIN ELECTRIC TECHNOLOGY CO., LTD., Hebei (CN)

( * ) Notice: Subject to any disclaimer, the term of this patent is extended or adjusted under 35 U.S.C. 154(b) by 177 days.

(21) Appl. No.: 18/265,811

(22) PCT Filed: Dec. 2, 2021

(86) PCT No.: PCT/CN2021/135185
§ 371 (c)(1),
(2) Date: Jun. 7, 2023

(87) PCT Pub. No.: WO2022/121781
PCT Pub. Date: Jun. 16, 2022

(65) Prior Publication Data
US 2023/0387677 A1 Nov. 30, 2023

(30) Foreign Application Priority Data
Dec. 12, 2020 (CN) .......................... 202011453631.0

(51) Int. Cl.
*H02H 3/10* (2006.01)
*H02H 3/08* (2006.01)

(52) U.S. Cl.
CPC ............ *H02H 3/083* (2013.01); *H02H 3/105* (2013.01)

(58) Field of Classification Search
CPC ........ H02H 3/083; H02H 3/165; H02H 3/307; H02H 3/33; H02H 3/337; H02H 3/162;
(Continued)

(56) References Cited

U.S. PATENT DOCUMENTS 5,587,864 A 12/1996 Gale et al.
2020/0044436 A1* 2/2020 Alibert ............. G01R 19/16547

FOREIGN PATENT DOCUMENTS

| CN | 101505053 A | 8/2009 |
| CN | 102231517 A | 11/2011 |

(Continued)

OTHER PUBLICATIONS

International Search Report mailed Feb. 28, 2022 in corresponding PCT application No. PCT/CN2021/135185.

*Primary Examiner* — Bryan R Perez
(74) *Attorney, Agent, or Firm* — Nields, Lemack & Frame, LLC

(57) ABSTRACT

A method for processing an interphase short circuit is provided, including: when a two-phase or three-phase interphase short circuit occurs in a line, maintaining a fault phase of the line to be conducted and tripping off the remaining fault phases, and artificially grounding another fault phase connected to the fault phase or directly utilizing an existing grounding point; connecting a neutral point or a charged phase of a three-phase ineffectively grounded power supply system other than the fault phase to the ground, so as to form a closed loop with the fault phase and generate a current, and detecting a current duration by a controlled switch. When a certain controlled switch reaches a trigger condition and cuts off the line, a fault is cleared.

12 Claims, 2 Drawing Sheets

(58) Field of Classification Search
CPC .......... H02H 3/087; H02H 3/32; H02H 3/338; H02H 3/167; H02H 3/34; H02H 3/325; H02H 7/008; H02H 7/30; H02H 7/262; H02H 7/22; H02H 7/26; H02H 9/08
See application file for complete search history.

(56) References Cited

FOREIGN PATENT DOCUMENTS

| CN | 102998582 A | 3/2013 |
|----|-------------|--------|
| CN | 104779594 A | 7/2015 |
| CN | 109412124 A | 3/2019 |
| CN | 113725823 A | 11/2021 |

* cited by examiner

METHOD FOR PROCESSING INTERPHASE SHORT CIRCUIT

CROSS-REFERENCE TO RELATED APPLICATION

This application is a national stage of International Application No. PCT/CN2021/135185, filed on Dec. 2, 2021, which claims priority to Chinese Patent Application No. 2020114536310, filed on Dec. 12, 2020. Both of the aforementioned applications are hereby incorporated by reference in their entireties.

TECHNICAL FIELD

The present disclosure relates to the field of power supply system fault processing, in particular to a method for processing an interphase short circuit fault of a three-phase ineffectively grounded power supply system.

BACKGROUND

At present, common methods used when an interphase short circuit occurs in a certain line of the three-phase ineffectively grounded power supply system are as follows. 1) a reclosing method, in which the first circuit breaker on the line is firstly cut off and then the first circuit breaker is closed, and if the interphase short circuit is instantaneous and can be eliminated after the first circuit breaker is closed, normal power supply is continued; and if the interphase short circuit fault still exists after the first circuit breaker is closed, the first circuit breaker is cut off for maintenance. 2) a temporal stage difference coordination method, in which for the circuit breakers in the same line, different overcurrent trip times are set according to the distances from the power source, the closer to the power source, the longer the trip time is. Generally, the stage difference is set to be 100 ms, which is determined by the mechanical action time of the switch and the time spent by the algorithm. This method can isolate the fault area, but for the fault where the fault point is close to the power source, the power supply system withstands short-circuit current for a long time and has a great impact on the power grid. 3) the first circuit breaker overflows and firstly trips off, and then the last circuit breaker trips off. If the fault occurs at downstream of the last circuit breaker, the fault can be cleared. Otherwise, when the first circuit breaker is reclosed, a fault current still exists, the first circuit breaker overflows and then trips off, and then the penultimate circuit breaker is cut off. If the interphase short circuit occurs between the penultimate circuit breaker and the last circuit breaker, the fault can be cleared, and the circuit breakers at the upstream can be cut off in turn until the fault is cleared. However, during the operational process, the uncut circuit breaker and the power supply system are continuously subjected to large short-circuit current impact, which can cause damage to the line if the duration is too long or the frequency of occurrence is too high. If the duration of the interphase short circuit cannot exceed 300 milliseconds and the trip-off time of the circuit breaker is 100 milliseconds, it is not advisable to provide more than three circuit breakers in the line, otherwise the above method may lead to an impact of the line exceeding 300 milliseconds. It can be seen that the existing methods for processing interphase short circuit have the disadvantages of being long in consumed time in processing faults and incapable of automatically clearing the faults.

SUMMARY

Technical Problems

An objective of some embodiments of the present disclosure is to provide a method for processing an interphase short circuit. By means of the method, an interphase short circuit fault point section can be quickly positioned in a three-phase ineffectively grounded power supply system, the fault can be automatically and accurately cleared, the processing quality of the interphase short circuit fault can be well improved, and the power supply safety is improved.

Solutions to the Problems

Technical Solutions

In order to achieve the above objective, the present disclosure adopts the following technical solutions. A method for processing an interphase short circuit is provided, where a plurality of controlled switches are distributed on a three-phase ineffectively grounded power supply system, and the controlled switches cut off a line according to a current duration; when a simple two-phase or three-phase short circuit occurs in a line, following method (a) is performed, including: (a) maintaining a fault phase of the line to be conducted and tripping off remaining fault phases, and artificially grounding another fault phase connected to the fault phase; connecting a system neutral point or a charged phase of the three-phase ineffectively grounded power supply system other than the fault phase to a ground, so as to form a closed loop with the fault phase and generate a current, setting a current duration for triggering a cut off of controlled switches at downstream of a power source to be smaller than that for triggering a cut off of controlled switches at upstream of the power source, and when a certain controlled switch reaches a trigger condition and cuts off the line, stopping the other fault phase from being grounded, and stopping the charged phase or the system neutral point being connected to the ground; and when a two-phase or three-phase short circuit accompanied with a ground fault occurs in a line, the method (a) is performed, or following method (b) is performed, including: (b) maintaining a fault phase of the line to be conducted and tripping off remaining fault phases; connecting a system neutral point or a charged phase of the three-phase ineffectively grounded power supply system other than the fault phase to the ground, so as to form a closed loop with the fault phase and generate a current, setting a current duration for triggering a cut off of controlled switches at downstream of a power source to be smaller than that for triggering a cut off of controlled switches at upstream of the power source, and when a certain controlled switch reaches a trigger condition and cuts off a line, stopping the charged phase from being grounded.

Preferably, in the method (a) and the method (b), the maintaining a fault phase to be conducted includes firstly tripping off the fault phase and then conducting the fault phase, and not tripping off the fault phase.

Preferably, in the method (a), a first circuit breaker of the line trips off, the fault phase is shorted across the first circuit breaker through the first switch so as to conduct the fault phase, the first switch is a controlled switch, the other fault phase is artificially grounded at a lower port of the first circuit breaker through a third switch, the charged phase is connected to the ground at the upper port of the first circuit breaker or connected to the ground at the system neutral point through a second switch, so as to form a closed loop with the fault phase and generate a current, after the controlled switch reaches a trigger condition and cuts off the line, the first switch and the third switch are disconnected, the second switch is stopped from being grounded, and the first circuit breaker is closed.

Preferably, in the method (b), a first circuit breaker of the line trips off, the fault phase is shorted across the first circuit breaker through a first switch so as to conduct the fault phase, the first switch is the controlled switch, the charged phase is connected to the ground at the upper port of the first circuit breaker or connected to the ground at the system neutral point through a second switch, so as to form a closed loop with the fault phase and generate a current, after the controlled switch reaches a trigger condition and cuts off the line, the first switch is disconnected, the second switch is stopped from being grounded, and then the first circuit breaker is closed.

Preferably, the second switch is an electronic power switch.

Preferably, the electronic power switch is an insulated gate bipolar transistor.

Preferably, the controlled switch is turned off in time upon reaching the trigger condition to avoid a case where a current duration detected by a last controlled switch reaches the trigger condition of the last controlled switch.

Preferably, in the method (a), a current limiting resistor is connected in series in the closed loop.

Preferably, a current limiting resistor is connected in series between the second switch and the ground.

Preferably, the current limiting resistor is an adjustable resistor.

Beneficial Effects of the Disclosure

Beneficial Effects

The present disclosure has the following beneficial effects. After the interphase short circuit fault occurs, the original fault current is cut off, and an appropriate current can be artificially formed and flows through all the original fault loops or a new loop of part of the fault loops, which is beneficial for fault detection and clearance. Specifically, a fault phase is grounded in a single-phase manner, and another fault phase is disconnected (two-phase short circuit) or the third phase is disconnected at the same time (three-phase short circuit). Then, the system neutral point or the charged phase of the power supply system is connected to the ground, to form a closed loop with the ground fault and generate a controllable current. The current duration is detected by the controlled switch on the fault phase, and the current is cut off when the controlled switch reaches the trigger condition. The current duration for triggering a cut off of the controlled switch at the downstream of the power source is less than that for triggering a cut off of the controlled switch at the upstream of the power source, but the controlled switches located below the fault point of the interphase short circuit in the fault phase do not enter the closed loop, and no current flows therethrough. Therefore, the first controlled switch above the fault point of the interphase short circuit must be cut off firstly, thus clearing the interphase short circuit fault. In view of the above situation, if the interphase short circuit is accompanied with single-phase grounding, the grounding point can be directly used, or the artificially formed grounding point can be used. If the interphase short circuit is a simple interphase short circuit, the grounding point must be artificially formed. That is, it is necessary to form a grounding point on another fault phase through the third switch. When the grounding point is preferably located at the lower port of the first circuit breaker, or at other positions of the other fault phase, especially below the interphase short circuit point, the controlled switch on the other fault phase should be correspondingly arranged so as not to detect the phase current, so as not to be cut off earlier than the controlled switch expected to be cut off. Namely, an undetected phase can be set according to preset rules, for example, the phase B is not detected between the phase A and the phase B, the phase C is not detected between the phase A and the phase C, the phase C is not detected between the phase B and the phase C. and the phase C is not detected among the phase A, the phase B and the phase C, etc. According to the method, the interphase fault is converted into a single-phase ground fault, and the controlled switch can automatically trip off so as to clear the fault quickly, accurately and automatically. Then, the other fault phase can be stopped from being grounded, the charged phase is stopped from being grounded, and finally the first circuit breaker is closed to restore power supply.

BRIEF DESCRIPTION OF THE DRAWINGS

Description of the Drawings

Figure 1:
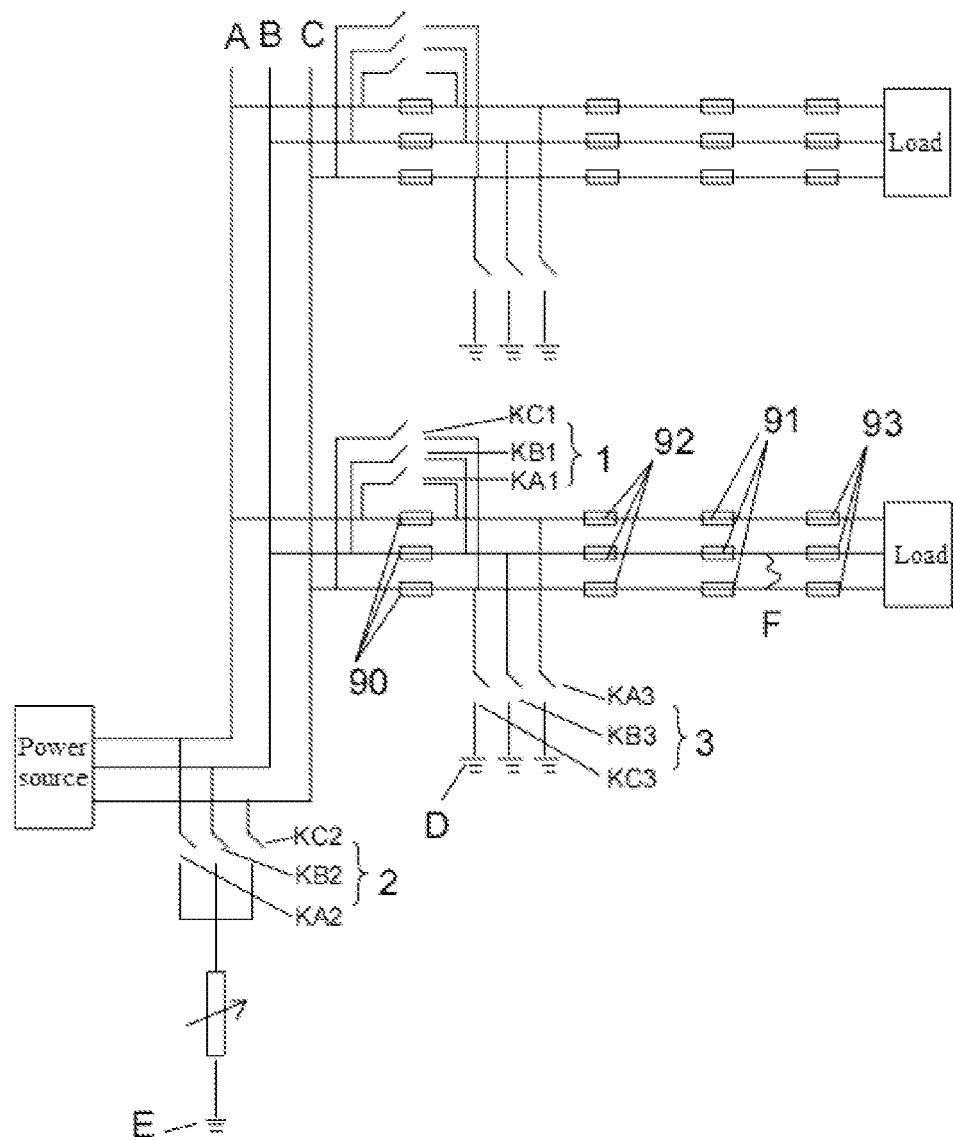
Figure 2:
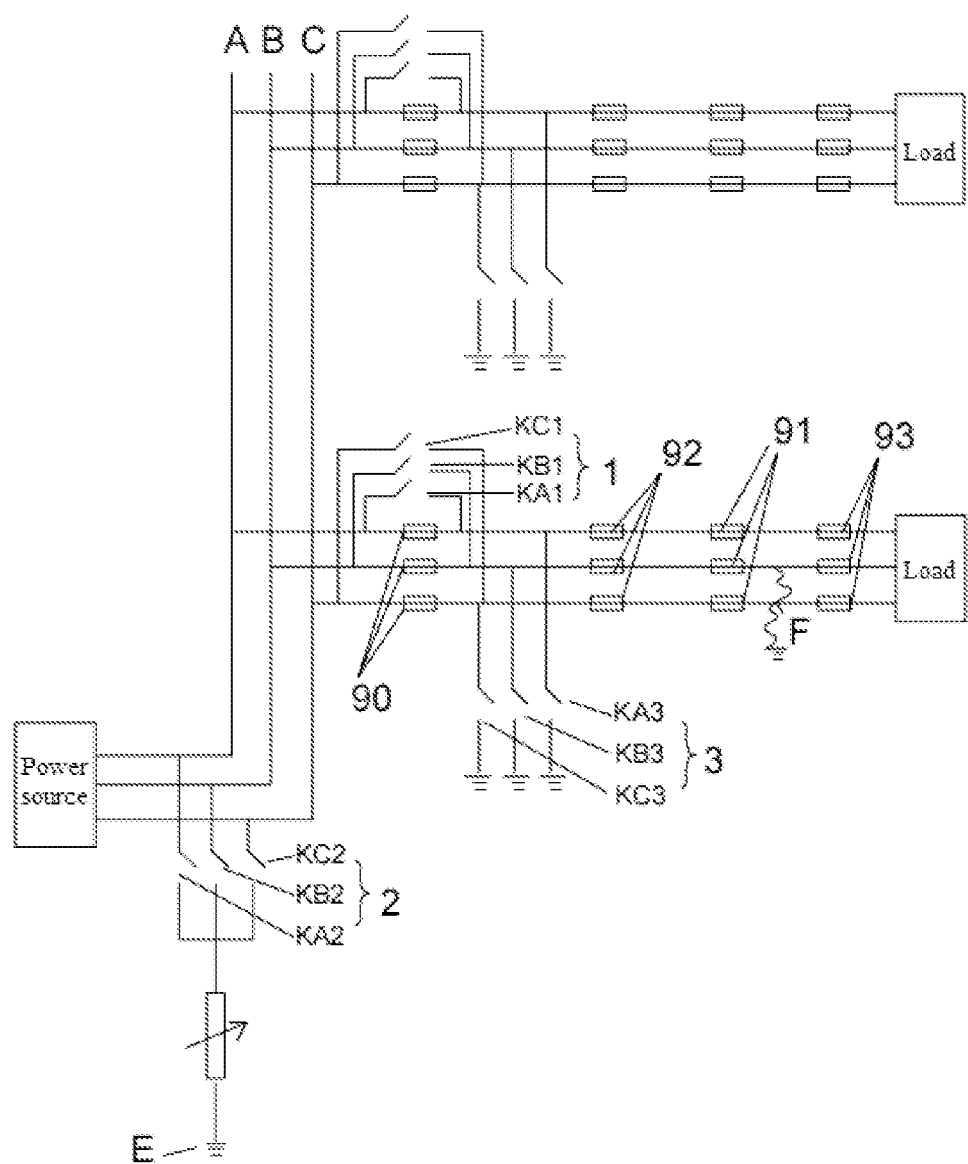

FIG. 1 is a wiring schematic diagram of one embodiment of the method in the present disclosure; and FIG. 2 is a wiring schematic diagram of another embodiment of the method in the present disclosure.

DETAILED DESCRIPTION OF THE EMBODIMENTS

Embodiments of the Present Disclosure

With reference to the attached figures, the present disclosure is further explained by specific embodiments. The three-phase power supply system is a common ineffectively grounded system. A plurality of outgoing lines are arranged on the bus of the three-phase power supply system. Each outgoing line is provided with a plurality of controlled switches. The controlled switches can detect the duration of the current on one phase, two phases or three phases of the line according to the setting, and can be set to cut off the three-phase line when the duration of the current passing through any phase reaches a preset value. In one specific embodiment with respect to the controlled switch, the controlled switch includes a control unit, a current detecting unit and an execution unit. The current detecting unit can detect the current of each phase of the three-phase line. The control unit compares the duration of the current detected by the current detecting unit with the preset value, and can send a signal when the duration of the current passing through any phase reaches the preset value, so that the execution unit cuts off the three-phase line. For the preset value of the current duration for triggering a cut-off, the preset value of the current duration of the controlled switch at downstream of a power source is smaller than that of the controlled switch in upstream of the power source. The controlled switch in upstream of the power source is relatively closer to the power source, and the controlled switch in downstream of the power source is relatively farther away from the power source, that is, electric energy is generated from the power source and transmitted from the upstream to the downstream. In other words, according to the upstream and downstream of the power source, the farther the controlled switch is away from the power source, the smaller the preset value of the current duration for triggering a cut-off of the controlled switch is, the more easily the controlled switch reaches a trigger condition to be cut off. In practice, a circuit breaker arranged on each outgoing line can detect the duration of the current flowing through the circuit breaker, and can set a certain phase or several phases so that the line is cut off after the current passes therethrough for a certain duration, so the circuit breaker can be regarded as a controlled switch.

As shown in FIG. 1, in one specific embodiment, a first circuit breaker 90 is arranged on each outgoing line in phase A, phase B and phase C near the bus. A first switch 1 is installed at the first circuit breaker 90, and includes three switches KA1, KB1 and KC1 installed on the phase A, phase B and phase C. The first switch is a controlled switch, that is, the switches KA1, KB1 and KC1 can be cut off according to the preset duration of the current. For a certain phase, the first switch 1 can form a short-circuit connection across the first circuit breaker 90 (for example, after the first circuit breaker 90 cuts off the line, the switch KA1 in the first switch 1 is closed, namely, the phase A can be shorted so that the phase A is conducted again through bypassing the first circuit breaker 90). In this way, even if the first circuit breaker is cut off, the shorted phase is still conducted and charged (of course, the first circuit breaker can be configured to keep one phase from being cut all the way, so that the phase is charged all the way without shorting). A plurality of circuit breakers are arranged below the first circuit breaker 90 (these circuit breakers below the first circuit breaker can be regarded as controlled switches). Each circuit breaker can cut off the three-phase line according to the duration of the current in a certain phase. A third switch 3 is installed at a lower port of the first circuit breaker 90 of each outgoing line, and three switches KA3, KB3 and KC3 in the third switch 3 can connect the phase A, phase B and phase C with the ground, so that any phase can be grounded. Further, a second switch 2 is also installed on the bus (namely, the second switch 2 is located at the upper port of the first circuit breaker 90, or the second switch 2 is installed on a neutral point of the system, and in this case, only one phase switch is needed). Three switches KA2, KB2 and KC2 in the second switch 2 can connect or disconnect the three phases of the bus to or from the ground. In a preferred example, a resistance adjustable resistor is arranged in series at the second switch 2 to limit current and avoid damaging the system due to excessive interphase short-circuit current. If the simple interphase short circuit (such as short circuit between the phase B and the phase C or short circuit among the three phases) occurs at point F, firstly, the first circuit breaker 90 trips off to cut off the three-phase circuit, then a fault phase is conducted and charged by closing one switch in the first switch 1 (for example, phase B is conducted and charged by closing the switch KB1), and then another fault phase is connected to the ground point D by using one switch in the third switch 3 at the lower port of the first circuit breaker 90 (namely, phase C is connected to the ground point D by closing the switch KC3). In this way, the phase B of the line passes through the short circuit point F to the C phase and then to the grounding point D, thus forming single-phase grounding. Then, through one switch KA2 in the second switch, the phase A (in this case, the phase A is a charged phase) is connected to the ground at the upper port of the first circuit breaker, thus generating a current (or the phase C is connected to the ground by using the switch KC2, thereby forming a closed loop and generating a current). The current flows through the fault phase B through the grounding point E of the second switch, the grounding point D of the third switch and the interphase short circuit point F. When the duration of the current reaches the trigger condition of the closest controlled switch 91 at upstream of the interphase short circuit point F, the controlled switch 91 cuts off the line, thereby excluding the interphase short circuit point F from the system (due to timely cut-off, the duration of the current during cut-off does not reach the trigger condition of the controlled switch 92 at further upstream, so the controlled switch 92 cannot be cut off; and the controlled switch 93 at downstream of the interphase short circuit point in the phase B cannot operate because no current flows therethrough). Then the switch KB1 in the first switch 1 is disconnected, the KC3 in the third switch 3 is stopped from being grounded, the KA2 in the second switch is stopped from being grounded, and the first circuit breaker 90 is finally closed to restore the power supply of the line.

In one embodiment, the first circuit breaker can be controlled separately for three phases and has the function of a controlled switch. In this case, the first circuit breaker can be directly used for keeping a fault phase on and tripping off other fault phases. At the same time, the duration of the current for triggering the cut-off of the first circuit breaker can be set to be the longest (namely, longer than that of the second circuit breaker). If the circuit breaker at downstream of the first circuit breaker (used as a controlled switch) does not trip off, it means that the interphase short circuit occurs between the first circuit breaker and the second circuit breaker. According to the set trigger condition, the first circuit breaker must trip off, thus isolating the fault.

As shown in FIG. 2, in another specific embodiment, if an interphase short circuit occurs at point F, accompanied with a grounding at the short circuit point, an artificial grounding point can still be formed by using the third switch in the above method, and then a current can be generated through the second switch, namely, the above method is still applicable. In the case of the accompanied ground fault, there is another method. Firstly, the first circuit breaker 90 trips off to cut off the three-phase line, and then the switch KB1 of the first switch is closed, so that single-phase grounding is formed by directly using the grounding point at the short circuit point. Then, the phase A (or phase C) is connected to the ground at the upper port of the first circuit breaker through the second switch, thus generating a current. The current flows through the fault phase B through the grounding point E of the second switch and the grounding point F at the interphase short circuit point. When the duration of the current reaches the trigger condition of the closest controlled switch 91 at upstream of the interphase short circuit point, the controlled switch 91 cuts off the line, thus excluding the interphase short circuit point F from the system. Then, the switch KB1 in the first switch is disconnected, the charged phase is stopped from being grounded by the second switch 2, and the first circuit breaker 90 is closed to restore the power supply of the line.

In the above embodiment, the tripping of the controlled switch should be timely, and the current durations of different controlled switches should be different sufficiently, so as to avoid the case where during a tripping process of one controlled switch, a previous controlled switch also trips off in response to detecting that the current duration meets the trigger condition, thus avoiding unreasonable large-area power outage. After the controlled switch trips off, the second switch can be stopped from being grounded.

The above processing method can also clear faults when three-phase short circuit and/or accompanied grounding occurs at interphase short circuit points.

In one specific embodiment, a grounding within a short period is achieved by using an electronic power switch, such as an insulated gate bipolar transistor.

The above embodiments are merely description of inventive concept and implementations and are not limited, and under the inventive concept, technical solutions that are not materially transformed are still within the scope of protection.

INDUSTRIAL PRACTICABILITY

Through the experiment in the three-phase power supply system, the above method is completely feasible.

What is claimed is:

1. A method for processing an interphase short circuit, wherein a plurality of controlled switches are distributed on a three-phase ineffectively grounded power supply system, and the controlled switches cut off a line according to a current duration;
    when a simple two-phase or three-phase short circuit occurs in a line, following method (a) is performed, comprising:
    (a) maintaining a fault phase of the line to be conducted and tripping off remaining fault phases, and artificially grounding another fault phase connected to the fault phase; connecting a neutral point or a charged phase of the three-phase ineffectively grounded power supply system other than the fault phase to a ground, so as to form a closed loop with the fault phase and a generate a current, setting a current duration for triggering a cut off of controlled switches at downstream of a power source to be smaller than that for triggering a cut-off of controlled switches at upstream of the power source, and when a certain controlled switch reaches a trigger condition and cuts off the line, stopping the other fault phase from being grounded, and stopping the charged phase or the neutral point from being connected to the ground; and
    when a two-phase or three-phase short circuit accompanied with a ground fault occurs in a line, the method (a) is performed, or following method (b) is performed, comprising:
    (b) maintaining a fault phase of the line to be conducted and tripping off remaining fault phases; connecting a neutral point or a charged phase of the three-phase ineffectively grounded power supply system other than the fault phase to a ground, so as to form a closed loop with the fault phase and generate a current, setting a current duration for triggering a cut-off of controlled switches at downstream of a power source to be smaller than that for triggering a cut-off of controlled switches at upstream of the power source, and when a certain controlled switch reaches a trigger condition and cuts off the line, stopping the charged phase or the neutral point from being grounded.

2. The method according to claim 1, wherein in the method (a) and the method (b), the maintaining a fault phase to be conducted comprises firstly tripping off the fault phase and then conducting the fault phase, and not tripping off the fault phase.

3. The method according to claim 1, wherein in the method (a), a first circuit breaker of the line trips off, the fault phase is shorted across the first circuit breaker through a first switch so as to conduct the fault phase, the first switch is a controlled switch, the other fault phase is artificially grounded at a lower port of the first circuit breaker through a third switch, the charged phase is connected to the ground at a upper port of the first circuit breaker or connected to the ground at the neutral point through a second switch, so as to form a closed loop with the fault phase and generate a current, after a certain controlled switch reaches the trigger condition and cuts off the line, the first switch and the third switch are disconnected, the second switch is stopped from being grounded, and the first circuit breaker is closed.

4. The method according to claim 1, wherein in the method (b), a first circuit breaker of the line trips off, the fault phase is shorted across the first circuit breaker through a first switch so as to conduct the fault phase, the first switch is a controlled switch, the charged phase is connected to the ground at a upper port of the first circuit breaker or connected to the ground at the neutral point through a second switch, so as to form a closed loop with the fault phase and generate a current, after a certain controlled switch reaches the trigger condition and cuts off the line, the first switch is disconnected, the second switch is stopped from being grounded, and then the first circuit breaker is closed.

5. The method according to claim 3, wherein the second switch is an electronic power switch.

6. The method according to claim 5, wherein the electronic power switch is an insulated gate bipolar transistor.

7. The method according to claim 1, wherein the controlled switch is turned off in time upon reaching the trigger condition to avoid a case where a current duration detected by a last controlled switch reaches the trigger condition of the last controlled switch.

8. The method according to claim 1, wherein in the method (a) and the method (b), a current limiting resistor is connected in series in the closed loop.

9. The method according to claim 3, wherein a current limiting resistor is connected in series between the second switch and the ground.

10. The method according to claim 9, wherein the current limiting resistor is an adjustable resistor.

11. The method according to claim 4, wherein the second switch is an electronic power switch.

12. The method according to claim 4, wherein a current limiting resistor is connected in series between the second switch and the ground.

* * * * *